(12) United States Patent
Xu et al.

(10) Patent No.: US 11,721,411 B2
(45) Date of Patent: Aug. 8, 2023

(54) METHOD AND DEVICE FOR TESTING MEMORY CHIP BY CALCULATING RESISTANCE VALUES

(71) Applicant: CHANGXIN MEMORY TECHNOLOGIES, INC., Hefei (CN)

(72) Inventors: Jinghong Xu, Hefei (CN); Yuan-Chieh Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/669,520

(22) Filed: Feb. 11, 2022

(65) Prior Publication Data

US 2022/0343997 A1    Oct. 27, 2022

Related U.S. Application Data

(63) Continuation of application No. PCT/CN2021/112894, filed on Aug. 17, 2021.

(30) Foreign Application Priority Data

Apr. 23, 2021 (CN) .......................... 202110441989.X

(51) Int. Cl.
G11C 29/56 (2006.01)

(52) U.S. Cl.
CPC .............................. *G11C 29/56012* (2013.01)

(58) Field of Classification Search
CPC ............ G11C 29/56012; G11C 29/022; G11C 29/023
See application file for complete search history.

(56) References Cited

U.S. PATENT DOCUMENTS 6,172,938 B1    1/2001    Suzuki
6,246,248 B1 *  6/2001    Yamagishi ......... G01R 31/3004
                                                  324/762.02

(Continued)

FOREIGN PATENT DOCUMENTS

CN    1637952 A    7/2005
CN    106875966 A    6/2017

OTHER PUBLICATIONS

Supplementary European Search Report in the European application No. 21876735.8, dated May 9, 2023, 9 pgs.

*Primary Examiner* — Sultana Begum
(74) *Attorney, Agent, or Firm* — Cooper Legal Group, LLC

(57) ABSTRACT

A method for testing a memory chip includes: in response to read command for the memory chip, controlling clock signal to be kept in first state within first preset time period and at the same time controlling complementary clock signal to be kept in second state within first preset time period; in response to clock signal kept in the first state and complementary clock signal kept in the second state, keeping data strobe signal in the first state within second preset time period and at the same time keeping complementary data strobe signal in the second state within the second preset time period; and when the data strobe signal and the complementary data strobe signal are kept in first and second states respectively, controlling first and second driving modules connected respectively to data strobe terminal and complementary data strobe terminal to operate and measure first and second resistance values respectively.

20 Claims, 10 Drawing Sheets

(56) References Cited

U.S. PATENT DOCUMENTS

| 7,317,328 B2 | 1/2008 | Kim |
| 10,803,914 B1 | 10/2020 | Swanson |
| 2005/0134340 A1 | 6/2005 | Lee |
| 2005/0248375 A1 | 11/2005 | Jung |
| 2005/0251356 A1 | 11/2005 | Jung |
| 2007/0063731 A1 | 3/2007 | Kuroki |
| 2007/0070717 A1 | 3/2007 | Kim |
| 2008/0030222 A1 | 2/2008 | Jung |
| 2018/0197588 A1 | 7/2018 | Chen et al. |

\* cited by examiner

| In response to a read command for a memory chip, controlling a clock signal to be kept in a first state within a first preset time period and at the same time controlling a complementary clock signal to be kept in a second state within the first preset time period, the first state and the second state being opposite states | 22 |

| In response to the clock signal kept in the first state and the complementary clock signal kept in the second state, keeping a data strobe signal in the first state within a second preset time period and at the same time keeping a complementary data strobe signal in the second state within the second preset time period, the data strobe signal being outputted by a data strobe terminal of the memory chip, the complementary data strobe signal being outputted by a complementary data strobe terminal of the memory chip | 24 |

| When the data strobe signal is kept in the first state and the complementary data strobe signal is kept in the second state, controlling a first driving module connected to the data strobe terminal to operate and measure a first resistance value and controlling a second driving module connected to the complementary data strobe terminal to operate and measure a second resistance value | 26 |

FIG. 2

METHOD AND DEVICE FOR TESTING MEMORY CHIP BY CALCULATING RESISTANCE VALUES

CROSS-REFERENCE TO RELATED APPLICATIONS

This application is a continuation of International Application No. PCT/CN2021/112894, filed on Aug. 17, 2021, which claims priority to Chinese Patent Application No. 202110441989.X, filed on Apr. 23, 2021. The disclosures of International Application No. PCT/CN2021/112894 and Chinese Patent Application No. 202110441989.X are hereby incorporated by reference in their entireties.

TECHNICAL FIELD

The disclosure relates to the field of chip test technologies, and specifically, to a method for testing a memory chip, a computer device, and a medium.

BACKGROUND

There are various types of chip packages. The chip packages may generally be categorized into different types according to a packaging material of a chip package, a connection manner between a chip package and a Printed Circuit Board (PCB), and the appearance of a chip package. Different types of chip packages have different test methods and different test procedures.

With the rapid development of semiconductor and integrated circuit technologies, the market has increasingly high demand for chip products, and chip suppliers are facing increasing high requirements on production efficiency and supply quality. It is generally very difficult to apply a conventional semiconductor chip test method to test electrical performance parameters of a memory chip.

Common test terminals for a memory chip package generally include a data terminal, a power source terminal, a data strobe terminal, a complementary data strobe terminal, and the like. Restricted by structural properties and functional parameters of a memory chip, a current signal or a voltage signal acquired by the data strobe terminal or the complementary data strobe terminal of the memory chip is generally a pulse signal, and cannot be directly used to test electrical performance parameters of the memory chip. As a result, the data strobe terminal and the complementary data strobe terminal of the memory chip have test blind spots.

SUMMARY

An aspect of the disclosure provides a method for testing a memory chip, including: in response to a read command for the memory chip, controlling a clock signal to be kept in a first state within a first preset time period and at the same time controlling a complementary clock signal to be kept in a second state within the first preset time period, the first state and the second state being opposite states; in response to the clock signal kept in the first state and the complementary clock signal kept in the second state, keeping a data strobe signal in the first state within a second preset time period and at the same time keeping a complementary data strobe signal in the second state within the second preset time period, the data strobe signal being outputted by a data strobe terminal of a memory chip, the complementary data strobe signal being outputted by a complementary data strobe terminal of the memory chip; and when the data strobe signal is kept in the first state and the complementary data strobe signal is kept in the second state, controlling a first driving module connected to the data strobe terminal to operate and measure a first resistance value and controlling a second driving module connected to the complementary data strobe terminal to operate and measure a second resistance value.

Another aspect of the disclosure provides a computer device for testing a memory chip. The computer device includes a memory storing processor-executable instructions and a processor. The processor is configured to execute the stored processor-executable instructions to perform operations of: in response to a read command for the memory chip, controlling a clock signal to be kept in a first state within a first preset time period and at the same time controlling a complementary clock signal to be kept in a second state within the first preset time period, the first state and the second state being opposite states; in response to the clock signal kept in the first state and the complementary clock signal kept in the second state, keeping a data strobe signal in the first state within a second preset time period and at the same time keeping a complementary data strobe signal in the second state within the second preset time period, the data strobe signal being outputted by a data strobe terminal of the memory chip, the complementary data strobe signal being outputted by a complementary data strobe terminal of the memory chip; and when the data strobe signal is kept in the first state and the complementary data strobe signal is kept in the second state, controlling a first driving module connected to the data strobe terminal to operate and measure a first resistance value and controlling a second driving module connected to the complementary data strobe terminal to operate and measure a second resistance value.

Still another aspect of the disclosure provides a non-transitory computer-readable storage medium having stored thereon computer-executable instructions that, when executed by a processor, cause the processor to perform a method for testing a memory chip, the method including: in response to a read command for the memory chip, controlling a clock signal to be kept in a first state within a first preset time period and at the same time controlling a complementary clock signal to be kept in a second state within the first preset time period, the first state and the second state being opposite states; in response to the clock signal kept in the first state and the complementary clock signal kept in the second state, keeping a data strobe signal in the first state within a second preset time period and at the same time keeping a complementary data strobe signal in the second state within the second preset time period, the data strobe signal being outputted by a data strobe terminal of the memory chip, the complementary data strobe signal being outputted by a complementary data strobe terminal of the memory chip; and when the data strobe signal is kept in the first state and the complementary data strobe signal is kept in the second state, controlling a first driving module connected to the data strobe terminal to operate and measure a first resistance value and controlling a second driving module connected to the complementary data strobe terminal to operate and measure a second resistance value.

BRIEF DESCRIPTION OF THE DRAWINGS

To describe the technical solutions in the embodiments of the disclosure more clearly, the following briefly introduces the accompanying drawings required for describing the embodiments. Apparently, the accompanying drawings in the following description show merely some embodiments of the disclosure, and a person of ordinary skill in the art may still derive the drawings of other embodiments from these accompanying drawings without creative efforts.

FIG. 2 is a schematic flowchart of a method for testing a memory chip according to a first embodiment of the disclosure;

DETAILED DESCRIPTION

For ease of understanding of the disclosure, the disclosure is described more completely below with reference to the accompanying drawings. The preferred embodiments of the disclosure are given in the accompanying drawings. However, the disclosure may be implemented in various forms, and is not limited to the embodiments described herein. Rather, these embodiments are provided so that the disclosed content of the disclosure will be understood more thoroughly and completely.

Unless otherwise defined, the technical terms and scientific terms used herein have the same meanings as how they are generally understood by a person skilled in the art to which the disclosure pertains. The terms used herein in the specification of the disclosure are merely used for describing specific embodiments, but are not intended to limit the disclosure. The term "and/or" used herein encompasses any and all possible combinations of one or more of the associated listed items.

In the case in which "comprise," "have," and "include" described herein are used, another part may also be added unless explicit limitative terms such as "only" and "formed by . . ." are used. The terms in a singular form may include plural forms unless noted to the contrary, and cannot be understood that there is the quantity is 1.

It should be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the disclosure.

In the description of the disclosure, it needs to be noted that unless otherwise expressly specified and defined, "mounted", "connected", and "connection" should be understood in a broad sense, for example, fixedly connected, detachably connected, or integrally connected; or connected directly or through an intermediate, or two parts communicated internally. For persons skilled in the art, specific meanings of the terms in the disclosure should be understood according to specific conditions.

Figure 1:
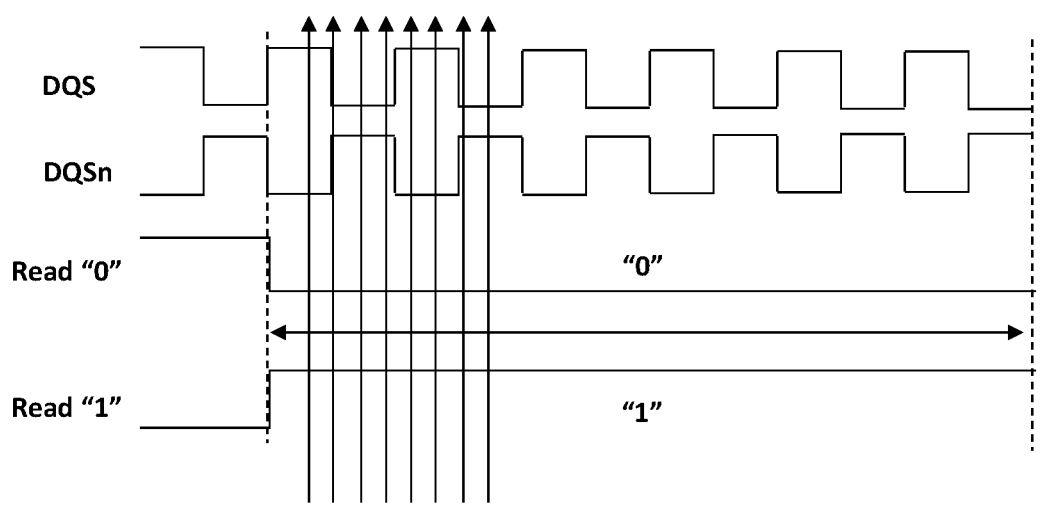
FIG. 1 is a schematic diagram of a timing diagram of an operation status of a data strobe signal and a complementary data strobe signal of a memory chip.

Referring to FIG. 1, for a semiconductor memory chip package, a data strobe terminal and a complementary data strobe terminal of the semiconductor memory chip package may be configured to test electrical performance parameters of a semiconductor memory chip. However, in a test process, a data strobe signal DQS acquired by the data strobe terminal and a complementary data strobe signal DQSn acquired by the complementary data strobe terminal are shown as pulse square wave signals in FIG. 1, and as a result cannot be directly used for testing electrical performance parameters of a memory chip, and the data strobe terminal and the complementary data strobe terminal of the memory chip have test blind spots. Therefore, how to control the data strobe signal DQS outputted by the data strobe terminal and the complementary data strobe signal DQSn outputted by the complementary data strobe terminal of the memory chip to be kept in a preset state in the test process becomes one of the technical problems that urgently need to be resolved in a process of testing the electrical performance parameters of the memory chip by the data strobe terminal and the complementary data strobe terminal of the memory chip.

Referring to FIG. 2, in an embodiment of the disclosure, a method for testing a memory chip is provided, including the following steps.

In step 22, in response to a read command for the memory chip, a clock signal is controlled to be kept in a first state within a first preset time period and at the same time a complementary clock signal is controlled to be kept in a second state within the first preset time period, the first state and the second state being opposite states.

In step 24, in response to the clock signal kept in the first state and the complementary clock signal kept in the second state, a data strobe signal is kept in the first state within a second preset time period and at the same time a complementary data strobe signal is kept in the second state within the second preset time period, the data strobe signal being outputted by a data strobe terminal of a memory chip, the complementary data strobe signal being outputted by a complementary data strobe terminal of the memory chip.

In step 26, when the data strobe signal is kept in the first state and the complementary data strobe signal is kept in the second state, a first driving module connected to the data strobe terminal is controlled to operate and measure a first resistance value and a second driving module connected to the complementary data strobe terminal is controlled to operate and measure a second resistance value.

Specifically, continuing to refer to FIG. 2, the clock signal of the memory chip is controlled to be kept in the first state such as a high level state within the first preset time period and at the same time the complementary clock signal of the memory chip is controlled to be kept in the second state such as a low level state within the first preset time period, the first state and the second state being opposite states. The clock signal is inputted into the memory chip through a clock terminal port of the memory chip, and the complementary clock signal is inputted into the memory chip through a complementary clock terminal port of the memory chip. Then the memory chip is controlled to respond to the read command for the memory chip, to enable the memory chip to keep, in response to the clock signal kept in the first state and the complementary clock signal kept in the second state, a data strobe signal in the first state within a second preset time period and at the same time keep a complementary data strobe signal in the second state within the second preset time period, the data strobe signal being outputted by a data strobe terminal of the memory chip, the complementary data strobe signal being outputted by a complementary data strobe terminal of the memory chip, so that while the data strobe signal is kept in the first state and the complementary data strobe signal is kept in the second state, the first driving module connected to the data strobe terminal is controlled to operate and measure the first resistance value and the second driving module connected to the complementary data strobe terminal is controlled to operate and measure the second resistance value. In the disclosure, a read command for the memory chip is sent to a memory chip, the memory chip is controlled to keep a clock signal in a first state within a first preset time period and keep a complementary clock signal in a second state within the first preset time period, and a data strobe signal is kept in the first state within a second preset time period and at the same time a complementary data strobe signal is kept in the second state within the second preset time period, so that a test current or a test voltage can be acquired by a data strobe terminal and a complementary data strobe terminal, a first driving module connected to the data strobe terminal operates and measures a first resistance value, and a second driving module connected to the complementary data strobe terminal operates and measures a second resistance value, to determine, according to the measured first resistance value and second resistance value, whether there is an anomaly in the memory chip. The test method in this embodiment is simple and has low costs and an adequate test effect.

Figure 3:
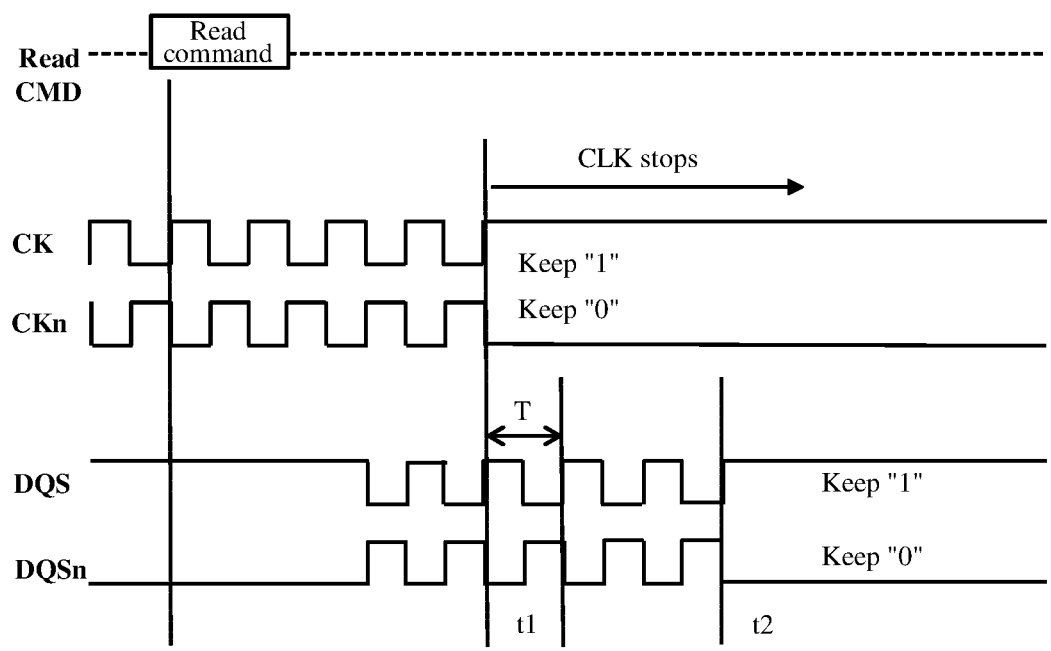
FIG. 3 is a schematic diagram of a timing diagram of a test status of a data strobe signal and a complementary data strobe signal of a memory chip according to an embodiment of the disclosure.

In an example, referring to FIG. 3, in an embodiment of the disclosure, the memory chip is controlled to respond to a read command for the memory chip Read CMD, and a clock signal CK of the memory chip is controlled to be kept in a high level state within the first preset time period and at the same time a complementary clock signal CKn of the memory chip is controlled to be kept in a low level state within the first preset time period. "Keep "1"" in FIG. 3 represents keeping a high level state, and "Keep "0"" in FIG. 3 represents keeping a low level state, to enable the memory chip to keep, in response to the read command, the clock signal CK in a high level state and keep the complementary clock signal CKn in a low level state, to keep the data strobe signal DQS in a high level state within the second preset time period and at the same time keep the complementary data strobe signal DQSn in a low level state within the second preset time period, so that while the data strobe signal DQS is kept in a high level state and the complementary data strobe signal DQSn is kept in a low level state, the first driving module connected to the data strobe terminal is controlled to operate and measure the first resistance value and the second driving module connected to the complementary data strobe terminal is controlled to operate and measure the second resistance value. In this embodiment, the read command for the memory chip Read CMD is sent to the memory chip, the clock signal CK of the memory chip is controlled to be kept in a high level state within the first preset time period, and the complementary clock signal CKn is kept in a low level state within the first preset time period, to keep the data strobe signal in a high level state within the second preset time period and at the same time keep the complementary data strobe signal in a low level state within the second preset time period, so that a test current or a test voltage can be acquired by a data strobe terminal and a complementary data strobe terminal, the first driving module connected to the data strobe terminal operates and measures the first resistance value, and the second driving module connected to the complementary data strobe terminal operates and measures the second resistance value, to determine, according to the measured first resistance value and second resistance value, whether there is an anomaly in the memory chip. The test method in this embodiment is simple and has low costs and an adequate test effect.

In an example, continuing to refer to FIG. 3, in an embodiment of the disclosure, a time difference between a starting point t2 of the second preset time period and a starting point t1 of the first preset time period is an integer multiple of a value T of a clock period of the clock signal CK. After the memory chip responds to the read command, the clock signal CK of the memory chip is controlled to be kept in the first state and at the same time the complementary clock signal CKn is controlled to be kept in the second state. In this case, a clock circuit such as a DLL circuit and/or a PLL circuit in the memory chip may enable a data strobe signal DQS to be kept in the first state and at the same time enable the complementary data strobe signal DQSn to be kept in the second state. That is, in the disclosure, inherent properties of a circuit inside the memory chip are used to implement the control of the data strobe signal DQS and the complementary data strobe signal DQSn, to enable a first driving circuit connected to the data strobe terminal to operate and measure the first resistance value and a second driving circuit connected to the complementary data strobe terminal to operate and measure the second resistance value.

Figure 4:
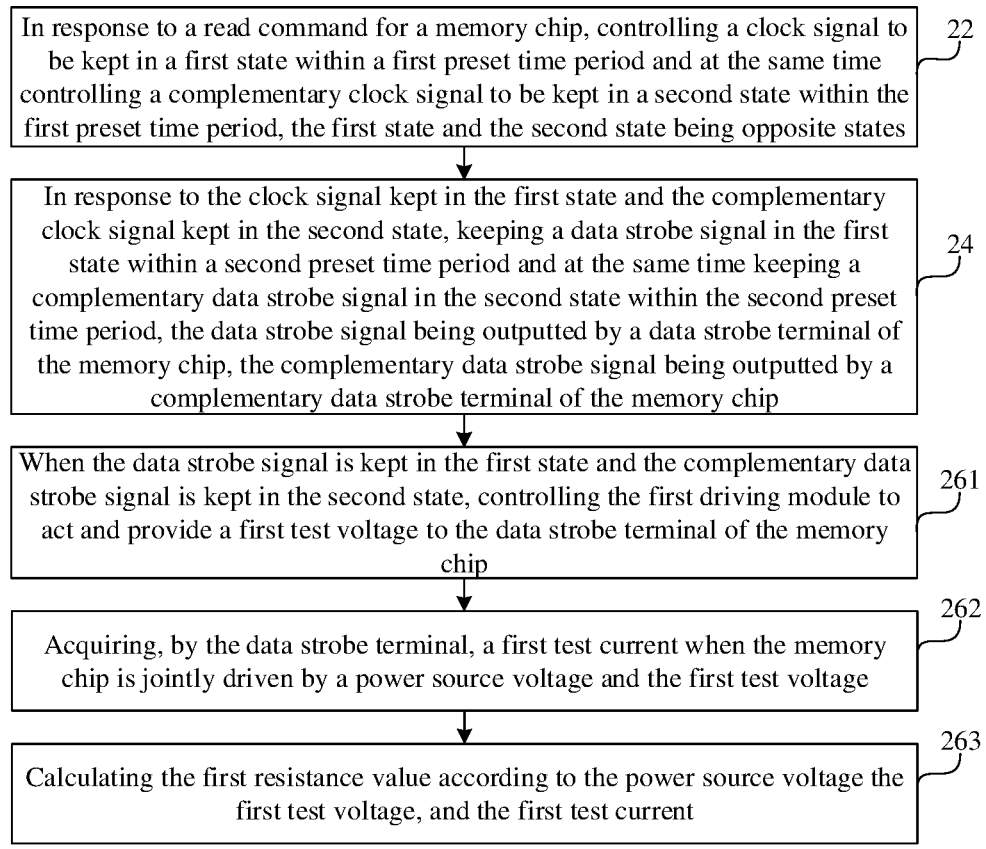
FIG. 4 is a schematic flowchart of a method for testing a memory chip according to a second embodiment of the disclosure.

Further, referring to FIG. 4, differences between this embodiment of the disclosure and the embodiment shown in FIG. 2 lie in that step 26 includes the following steps.

In step 261, when the data strobe signal is kept in the first state and the complementary data strobe signal is kept in the second state, the first driving module is controlled to act and provide a first test voltage to the data strobe terminal of the memory chip.

In step 262, the data strobe terminal acquires a first test current when the memory chip is jointly driven by a power source voltage and the first test voltage.

In step 263, the first resistance value is calculated according to the power source voltage, the first test voltage and the first test current.

Specifically, continuing to refer to FIG. 3 and FIG. 4, if the clock signal CK is kept in a high level state and the complementary clock signal CKn is kept in a low level state, the data strobe signal DQS is kept in a high level state and at the same time the complementary data strobe signal DQSn is kept in a low level state, the first driving module may be controlled to act and provide a first test voltage to the data strobe terminal of the memory chip, and the data strobe terminal acquires the first test current when the memory chip is jointly driven by the power source voltage and the first test voltage.

Figure 5:
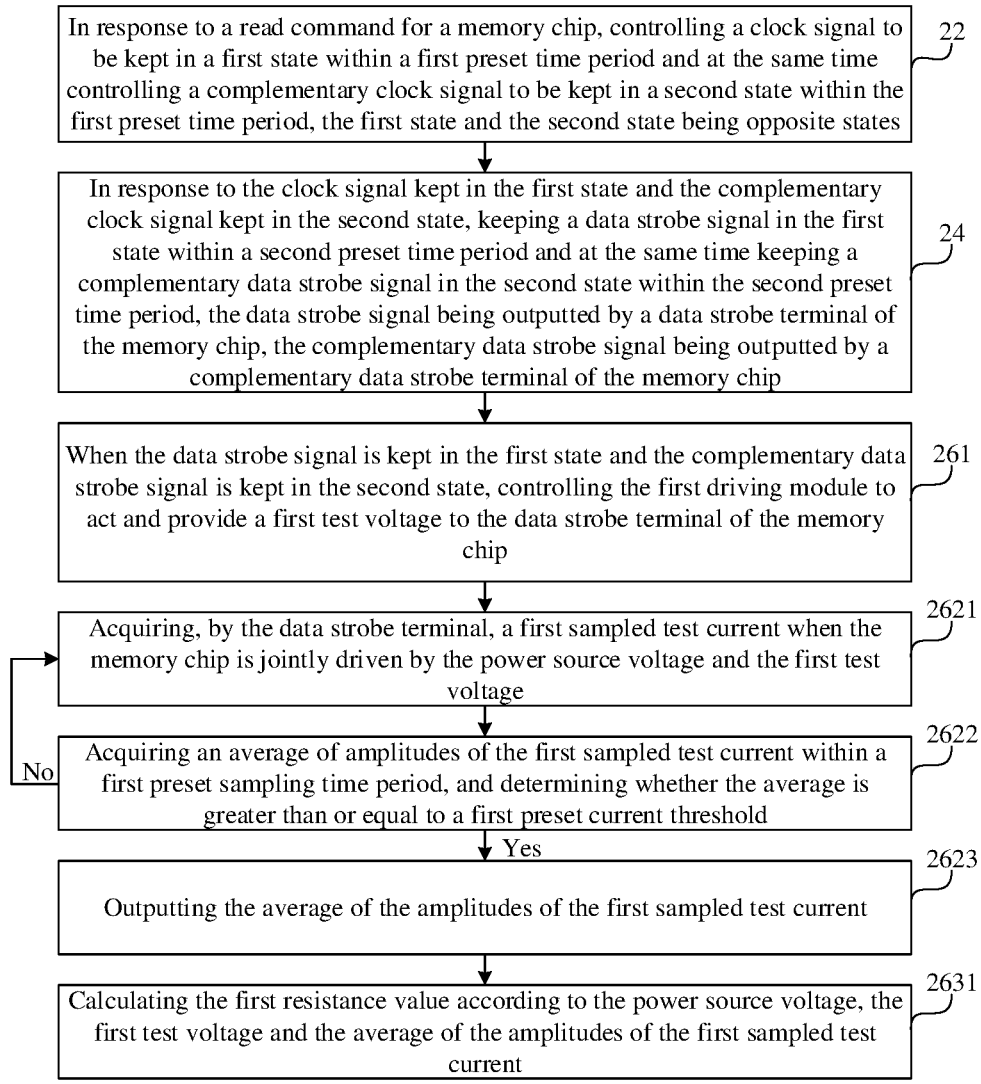
FIG. 5 is a schematic flowchart of a method for testing a memory chip according to a third embodiment of the disclosure.

In an example, referring to FIG. 5, a method for testing a memory chip is provided, including the following steps.

In step 22, in response to a read command for the memory chip, a clock signal is controlled to be kept in a first state within a first preset time period and at the same time a complementary clock signal is controlled to be kept in a second state within the first preset time period, the first state and the second state being opposite states.

In step 24, in response to the clock signal kept in the first state and the complementary clock signal kept in the second state, a data strobe signal is kept in the first state within a second preset time period and at the same time a complementary data strobe signal is kept in the second state within the second preset time period, the data strobe signal being outputted by a data strobe terminal of a memory chip, the complementary data strobe signal being outputted by a complementary data strobe terminal of the memory chip.

In step 261, when the data strobe signal is kept in the first state and the complementary data strobe signal is kept in the second state, the first driving module is controlled to act and provide a first test voltage to the data strobe terminal of the memory chip.

In step 2621, a first sampled test current when the memory chip is jointly driven by the power source voltage and the first test voltage is acquired by the data strobe terminal.

In step 2622, an average of amplitudes of the first sampled test current within a first preset sampling time period is acquired, and it is determined whether the average is greater than or equal to a first preset current threshold.

In step 2623, if the average is greater than or equal to the first preset current threshold, the average of the amplitudes of the first sampled test current is outputted.

In step 2631, the first resistance value is calculated according to the power source voltage, the first test voltage and the average of the amplitudes of the first sampled test current.

Specifically, continuing to refer to FIG. 5, the average of the amplitudes of the first sampled test current within the first preset sampling time period is acquired, and a first sampled test current with an average being greater than or equal to the first preset current threshold is acquired, to prevent excessive noise signals in the acquired first sampled test current, thereby avoiding affecting the accuracy of the first resistance value calculated according to the power source voltage, the first test voltage and the first test current.

Specifically, continuing to refer to FIG. 5, in an embodiment of the disclosure, the calculating the first resistance value according to the power source voltage, the first test voltage and the average of the amplitudes of the first sampled test current includes:

calculating the first resistance value $R_{pu}$ according to the following formula:

$$R_{pu} = \frac{V_{DDQ} - V_{Test1}}{I_{out1}}, \quad (1)$$

where $V_{DQQ}$ is the power source voltage, $V_{Test1}$ is the first test voltage, and $I_{out1}$ is the average of the amplitudes of the first sampled test current.

Figure 6:
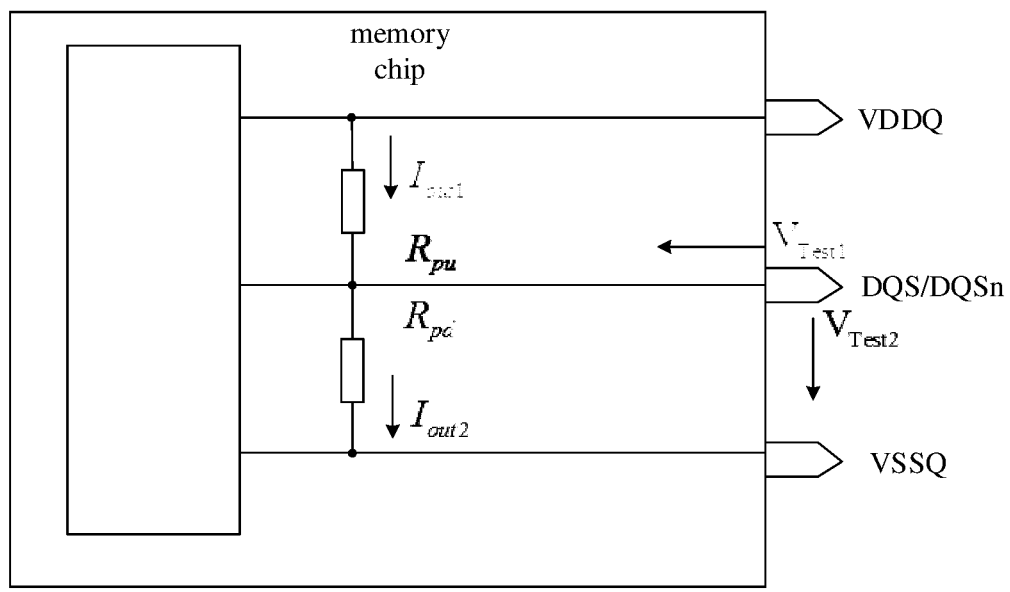
FIG. 6 is a schematic diagram of an application scenario of a method for testing a memory chip according to an embodiment of the disclosure.

In an example, continuing to refer to FIG. 5 and FIG. 6, when the memory chip is in a read data mode (an output driving mode) in response to the read command, an output driving circuit operates, a pull-up driving circuit operates, a pull-down driving circuit is turned off, and the pull-up driving circuit enables a data strobe terminal DQS to output a high level. In this case, the pull-up driving circuit is turned on, that is, the first driving module operates, and provides a first test voltage $V_{Test1}$ to the data strobe terminal DQS, to measure equivalent resistance $R_{pu}$ of the pull-up driving circuit, that is, the first driving module according to Formula (1).

Figure 7:
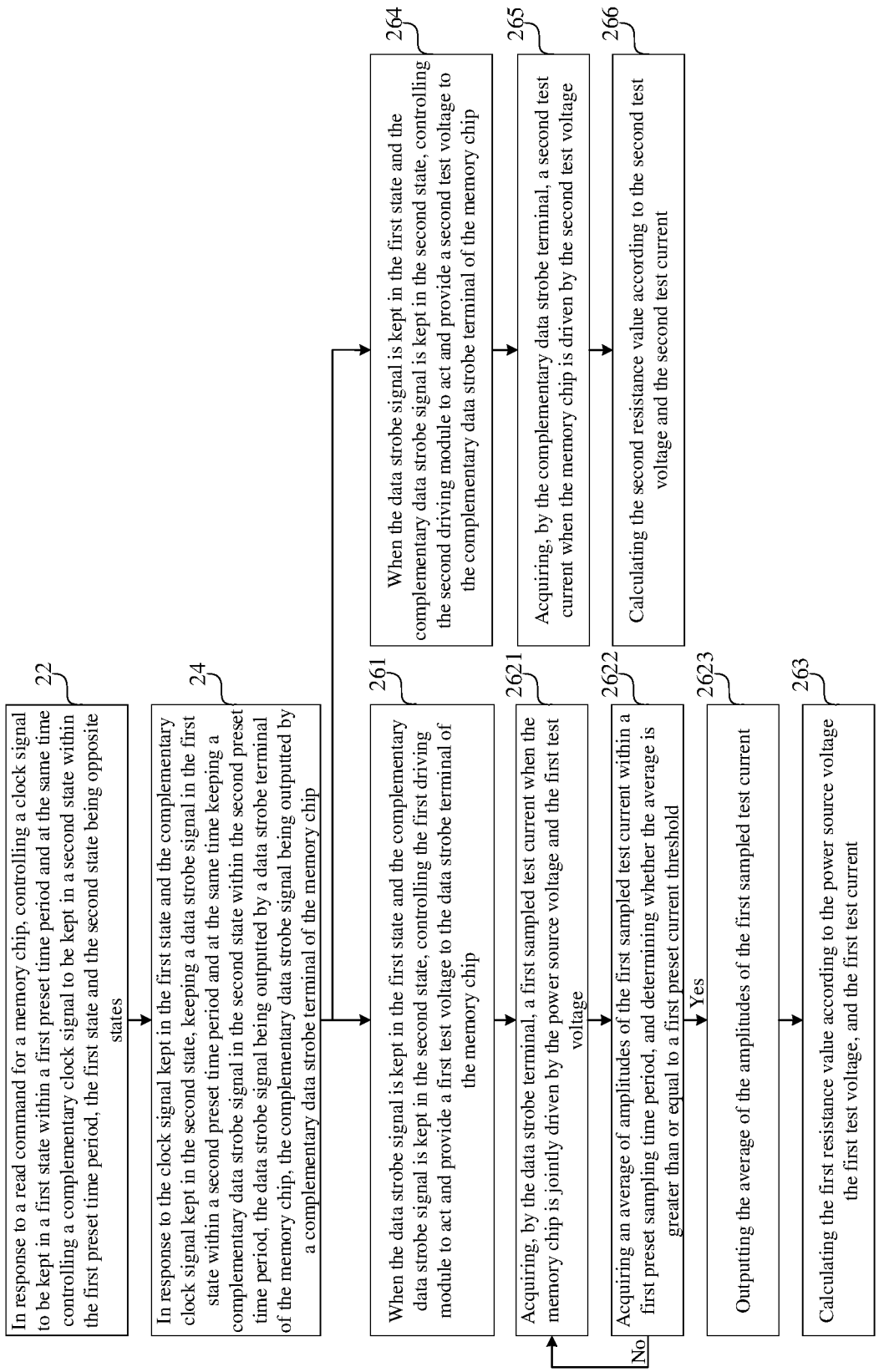
FIG. 7 is a schematic flowchart of a method for testing a memory chip according to a fourth embodiment of the disclosure.

In an example, referring to FIG. 7, differences between this embodiment of the disclosure and the embodiment shown in FIG. 5 lie in that, after step 24, the method further includes the following steps.

In step 264, when the data strobe signal is kept in the first state and the complementary data strobe signal is kept in the second state, the second driving module is controlled to act and provide a second test voltage to the complementary data strobe terminal of the memory chip.

In step 265, a second test current when the memory chip is driven by the second test voltage is acquired by the complementary data strobe terminal.

In step 266, the second resistance value is calculated according to the second test voltage and the second test current.

Specifically, continuing to refer to FIG. 7 and FIG. 3, when the data strobe signal DQS is kept in a high level state and the complementary data strobe signal DQSn is kept in a low level state, the second driving module is controlled to act and provide the second test voltage to the complementary data strobe terminal of the memory chip, to calculate the second resistance value according to the second test voltage and the second test current.

Figure 8:
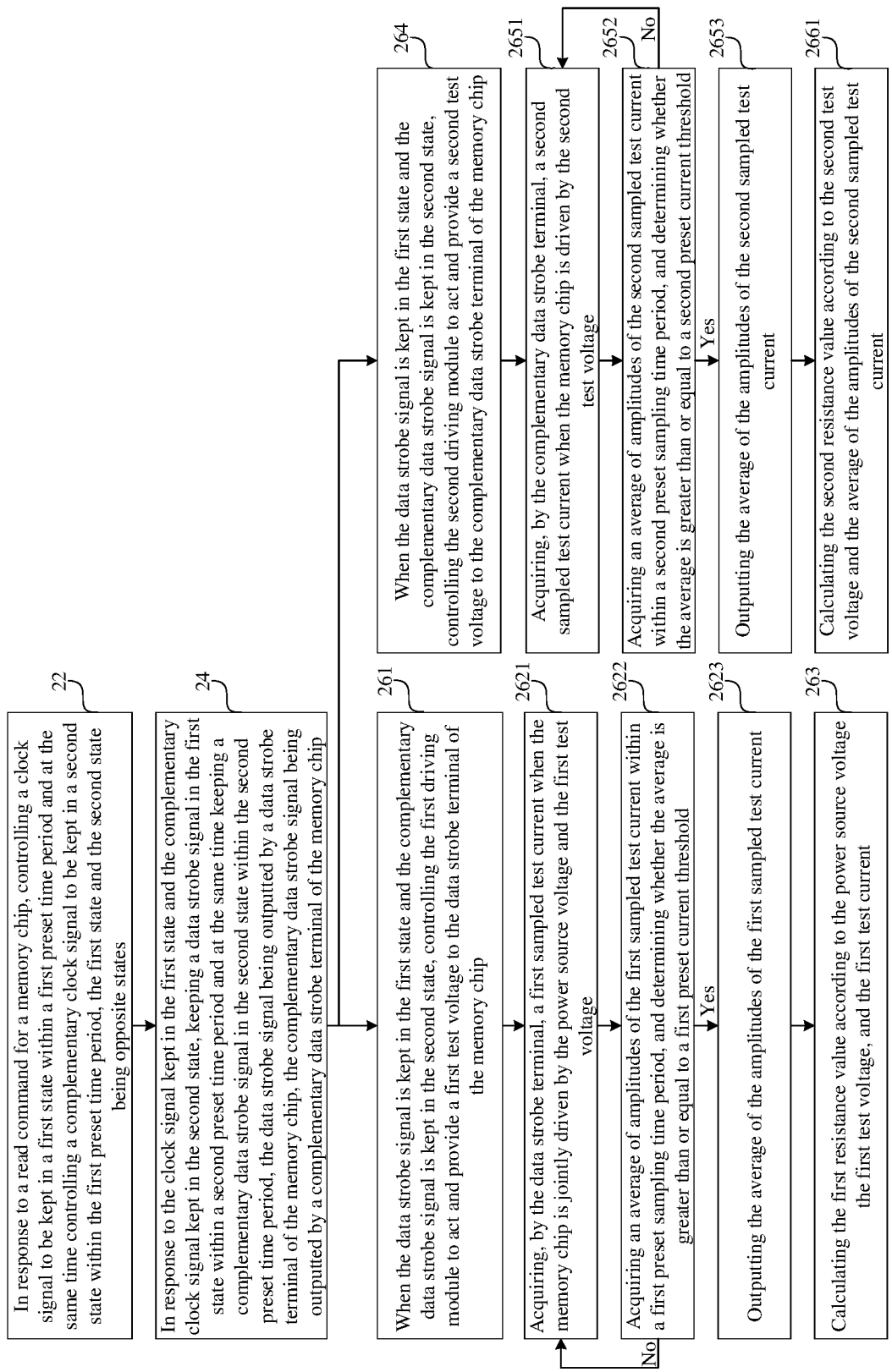
FIG. 8 is a schematic flowchart of a method for testing a memory chip according to a fifth embodiment of the disclosure.

Further, referring to FIG. 8, differences between this embodiment of the disclosure and the embodiment shown in FIG. 6 lie in that, after step 264, the method further includes the following steps.

In step 2651, a second sampled test current when the memory chip is driven by the second test voltage is acquired by the complementary data strobe terminal.

In step 2652, an average of amplitudes of the second sampled test current within a second preset sampling time period is acquired, and it is determined whether the average is greater than or equal to a second preset current threshold.

In step 2653, if the average is greater than or equal to the second preset current threshold, the average of the amplitudes of the second sampled test current is outputted.

In step 2661, the second resistance value is calculated according to the second test voltage and the average of the amplitudes of the second sampled test current.

Specifically, continuing to refer to FIG. 8, the obtained average of the amplitudes of the second sampled test current within the second preset sampling time period is acquired, and a second sampled test current with an average being greater than or equal to the second preset current threshold is acquired, to prevent excessive noise signals in the acquired second sampled test current, thereby avoiding affecting the accuracy of the second resistance value calculated according to the second test voltage and the second test current.

In an example, continuing to refer to FIG. 8, in an embodiment of the disclosure, the calculating the second resistance value according to the second test voltage and the average of the amplitudes of the second sampled test current includes:

calculating the second resistance value $R_{pd}$ according to the following formula:

$$R_{pd} = \frac{V_{Test2}}{I_{out2}}, \quad (2)$$

where $V_{Test\ 2}$ is the second test voltage, and $I_{out2}$ is the average of the amplitudes of the second sampled test current.

In an example, continuing to refer to FIG. 8 and FIG. 6, when the memory chip is in a read data mode (an output driving mode) in response to the read command, an output driving circuit operates, a pull-down driving circuit operates, a pull-up driving circuit is turned off, and the pull-down driving circuit enables a complementary data strobe terminal DQSn to output a low level. In this case, the pull-down driving circuit is turned on, that is, the second driving module operates, and provides the second test voltage $V_{Test2}$ to the complementary data strobe terminal DQSn, to measure the equivalent resistance $R_{pd}$ of the pull-down driving circuit, that is, a second driving circuit according to Formula (2).

Figure 9:
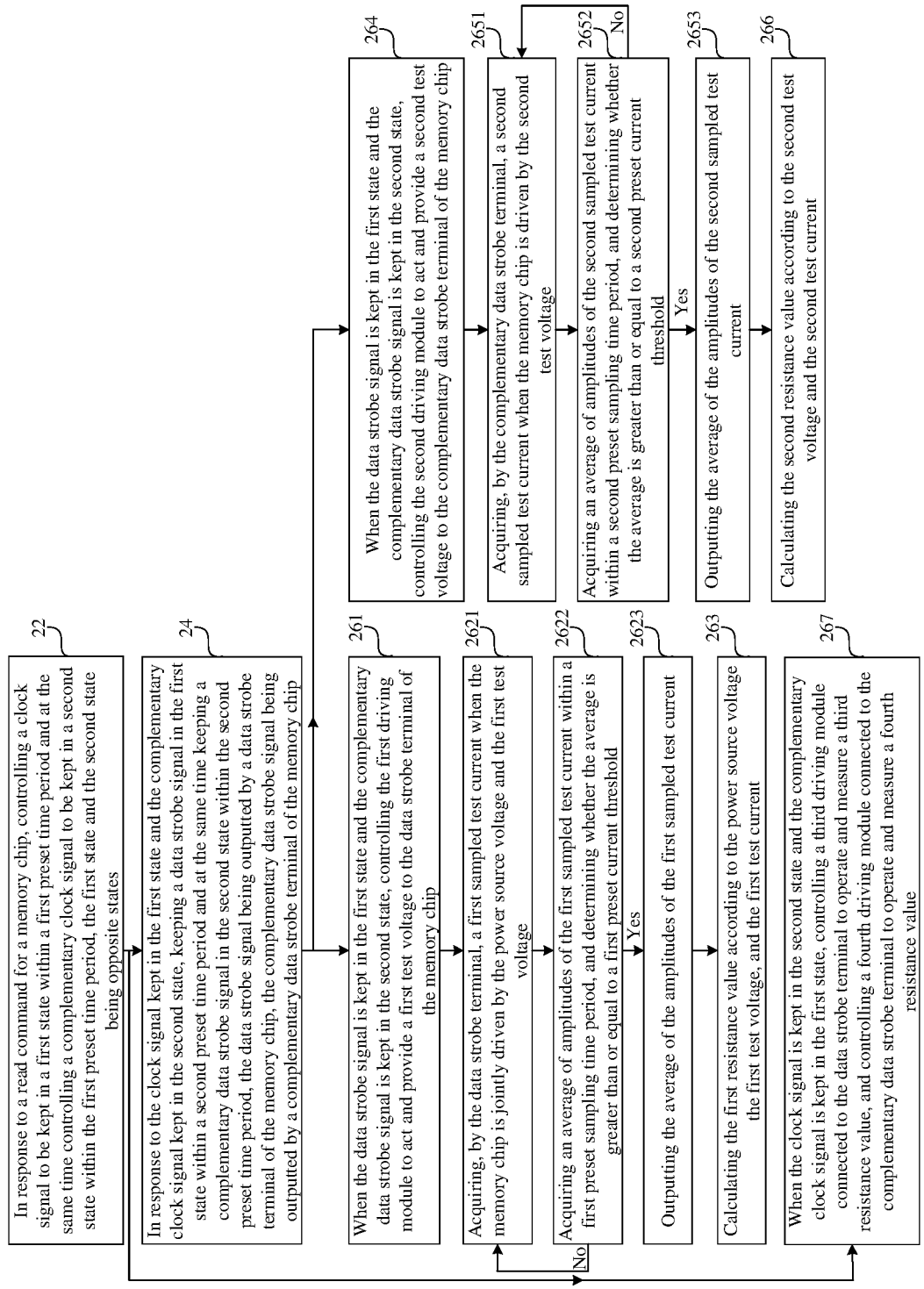
FIG. 9 is a schematic flowchart of a method for testing a memory chip according to a sixth embodiment of the disclosure.

Further, referring to FIG. 9, in an embodiment of the disclosure, the method for testing a memory chip further includes the following step.

In step 267, when the clock signal is kept in the second state and the complementary clock signal is kept in the first state, a third driving module connected to the data strobe terminal is controlled to operate and measure a third resistance value, and a fourth driving module connected to the complementary data strobe terminal is controlled to operate and measure a fourth resistance value.

In an example, because the data strobe terminal and the complementary data strobe terminal in a semiconductor memory chip package usually appear in pair, while the data strobe signal is kept in the first state and the complementary data strobe signal is kept in the second state, the first driving module connected to the data strobe terminal may be controlled to operate and measure the first resistance value and the second driving module connected to the complementary data strobe terminal may be controlled to operate and measure the second resistance value. While the data strobe signal is kept in the second state and the complementary data strobe signal is kept in the first state, the third driving module connected to the data strobe terminal is controlled to operate and measure the third resistance value; and the fourth driving module connected to the complementary data strobe terminal is controlled to operate and measure the fourth resistance value. In this embodiment, comprehensive test of the memory chip can be implemented by the data strobe terminal and the complementary data strobe terminal. The first resistance value and the fourth resistance value acquired in two test processes may be compared, and the second resistance value and the third resistance value are compared, to assist in determining whether there is an anomaly in the memory chip. The first resistance value and the fourth resistance value are both equivalent resistance values obtained by measuring the pull-up driving circuit, and the second resistance value and the third resistance value are both equivalent resistance values obtained by measuring the pull-down driving circuit.

It should be understood that although the various steps in the flowchart of the FIG. 2, FIG. 4, FIG. 5, and FIG. 7 to FIG. 9 are sequentially displayed as indicated by the arrows, these steps are not necessarily performed in the order indicated by the arrows. Except as explicitly stated herein, the execution of these steps is not strictly limited, and may be performed in other sequences. Moreover, at least some of the steps in FIG. 2 may include a plurality of substeps or stages, which are not necessarily performed at the same time, but may be performed at different time. The execution order thereof is also not necessarily performed sequentially, but may be performed alternately or alternately with at least a portion of other substeps or substeps or stages of other substeps.

Further, in an embodiment of the disclosure, a computer device is provided. The computer device may be a terminal, and an internal structural diagram of the terminal may be shown in FIG. 10. The computer device includes a processor, a memory, a network interface, a display screen and an input device that are connected by a system bus. The processor of the computer device is configured to provide a computing and control capability. The memory of the computer device includes a non-volatile storage medium and internal memory. The non-volatile storage medium stores an operating system and a computer program. The computer program is executed by the processor to implement a method for testing a memory chip. The display screen of the computer device may be a liquid crystal display screen or an e-ink display screen. The input device of the computer device may be a touch layer covering the display screen, or may be a button, a trackball or a touchpad disposed on a housing of the computer device, or may be an external keyboard, a touchpad or mouse or the like.

Figure 10:
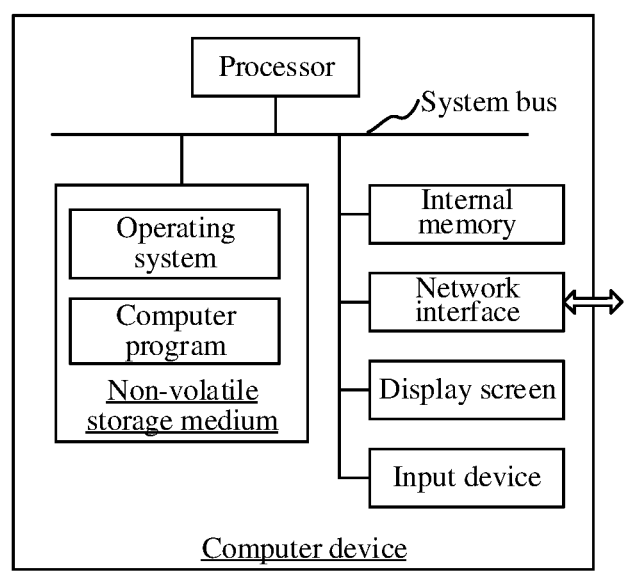
FIG. 10 is a schematic structural diagram of a computer device according to an embodiment of the disclosure.

It may be understood by those skilled in the art that the structure shown in FIG. 10 is only a block diagram of a partial structure related to the solution of the disclosure, but does not constitute a limitation to the computer device on which the solution of the disclosure is applied. The specific computer device may include more or fewer components than those shown in the drawings, or some components may be combined, or different component arrangements are used.

In an embodiment of the disclosure provides a computer-readable storage medium, storing a computer program, the computer program being executed by a processor to implement the steps in the method for testing a memory chip in any embodiment of the disclosure.

A person of ordinary skill in the art may understand that all or a part of the procedures in the methods of the embodiments may be implemented by a computer program instructing relevant hardware. The computer program may be stored in a non-volatile computer-readable storage medium. The computer program is executed to perform the procedures in the foregoing embodiments of the methods. Any usage of a memory, storage, a database or another medium in the embodiments of the disclosure may include non-volatile and/or volatile memories. The non-volatile memory may include a read-only memory (ROM), a programmable ROM (PROM), an electrically programmable ROM (EPROM), an electrically erasable programmable ROM (EEPROM) or a flash memory. The volatile memory may include a random access memory (RAM) or an external cache memory. For description, rather than for limitation, the RAM may be in various forms, for example, a static RAM (SRAM), a dynamic RAM (DRAM), a synchronous DRAM (SDRAM), a double data rate SDRAM (DDRS-DRAM), an enhanced SDRAM (ESDRAM), a Synchlink DRAM (SLDRAM), a Rambus direct RAM (RDRAM), a Direct Rambus Dynamic RAM (DRDRAM), and a memory bus dynamic RAM (RDRAM).

It is to be noted that the foregoing embodiments are only used for description but do not imply the limitation to the disclosure.

The technical features in the foregoing embodiments may be randomly combined. For simplicity of description, all possible combinations of the technical features in the foregoing embodiments are not described. However, it should be considered that these combinations of technical features fall within the scope recorded in the specification provided that these combinations of technical features do not have any conflict.

The foregoing embodiments only describe several embodiments of the disclosure, and their description is specific and detailed, but cannot therefore be understood as a limitation to the claims. It should be noted that for a person of ordinary skill in the art, several variations and improvements may further be made without departing from the concept of the disclosure. These variations and improvements should also be deemed as falling within the scope of protection of the disclosure. Therefore, the scope of protection of the patent of the disclosure shall be subject to the appended claims.

The invention claimed is:

1. A method for testing a memory chip, comprising:
in response to a read command for the memory chip, controlling a clock signal to be kept in a first state within a first preset time period and at the same time controlling a complementary clock signal to be kept in a second state within the first preset time period, the first state and the second state being opposite states;
in response to the clock signal kept in the first state and the complementary clock signal kept in the second state, keeping a data strobe signal in the first state within a second preset time period and at the same time keeping a complementary data strobe signal in the second state within the second preset time period, the data strobe signal being outputted by a data strobe terminal of the memory chip, the complementary data strobe signal being outputted by a complementary data strobe terminal of the memory chip; and
when the data strobe signal is kept in the first state and the complementary data strobe signal is kept in the second state, controlling a first driving module connected to the data strobe terminal to operate and measure a first resistance value and controlling a second driving module connected to the complementary data strobe terminal to operate and measure a second resistance value.

2. The method according to claim 1, wherein controlling the first driving module connected to the data strobe terminal to operate and measure the first resistance value comprises:
if the clock signal is kept in the first state, controlling the first driving module to act and provide a first test voltage to the data strobe terminal of the memory chip;
acquiring, by the data strobe terminal, a first test current when the memory chip is jointly driven by a power source voltage and the first test voltage; and
calculating the first resistance value according to the power source voltage, the first test voltage and the first test current.

3. The method according to claim 2, wherein acquiring, by the data strobe terminal, the first test current when the memory chip is jointly driven by the power source voltage and the first test voltage comprises:
acquiring, by the data strobe terminal, a first sampled test current when the memory chip is jointly driven by the power source voltage and the first test voltage;
acquiring an average of amplitudes of the first sampled test current within a first preset sampling time period, and determining whether the average is greater than or equal to a first preset current threshold;
if the average is greater than or equal to the first preset current threshold, outputting the average of the amplitudes of the first sampled test current; and
otherwise, reacquiring the first sampled test current.

4. The method according to claim 3, wherein calculating the first resistance value according to the power source voltage, the first test voltage and the first test current comprises:
calculating the first resistance value according to the power source voltage, the first test voltage and the average of the amplitudes of the first sampled test current.

5. The method according to claim 4, wherein calculating the first resistance value according to the power source voltage, the first test voltage and the average of the amplitudes of the first sampled test current comprises:
calculating the first resistance value $R_{pu}$ according to the following formula:

$$R_{pu} = \frac{V_{DDQ} - V_{Test1}}{I_{out1}},$$

where $V_{DDQ}$ is the power source voltage, $V_{Test1}$ is the first test voltage, and $I_{out1}$ is the average of the amplitudes of the first sampled test current.

6. The method according to claim 1, wherein controlling the second driving module connected to the complementary data strobe terminal to operate and measure the second resistance value comprises:
if the complementary clock signal is kept in the second state, controlling the second driving module to act and provide a second test voltage to the complementary data strobe terminal of the memory chip;
acquiring, by the complementary data strobe terminal, a second test current when the memory chip is driven by the second test voltage; and
calculating the second resistance value according to the second test voltage and the second test current.

7. The method according to claim 6, wherein the acquiring, by the complementary data strobe terminal, a second test current when the memory chip is driven by the second test voltage comprises:
acquiring, by the complementary data strobe terminal, a second sampled test current when the memory chip is driven by the second test voltage;
acquiring an average of amplitudes of the second sampled test current within a second preset sampling time period, and determining whether the average is greater than or equal to a second preset current threshold;
if the average is greater than or equal to the second preset current threshold, outputting the average of the amplitudes of the second sampled test current; and
otherwise, reacquiring the second sampled test current.

8. The method according to claim 7, wherein calculating the second resistance value according to the second test voltage and the second test current comprises:
calculating the second resistance value according to the second test voltage and the average of the amplitudes of the second sampled test current.

9. The method according to claim 8, wherein calculating the second resistance value according to the second test voltage and the average of the amplitudes of the second sampled test current comprises:
calculating the second resistance value $R_{pd}$ according to the following formula:

$$R_{pd} = \frac{V_{Test2}}{I_{out2}},$$

where $V_{Test2}$ is the second test voltage, and $I_{out2}$ is the average of the amplitudes of the second sampled test current.

10. The method according to claim 1, wherein a time difference between a starting point of the second preset time period and a starting point of the first preset time period is an integer multiple of a value of a clock period of the clock signal.

11. The method according to claim 1, further comprising:
when the clock signal is kept in the second state and the complementary clock signal is kept in the first state, controlling a third driving module connected to the data strobe terminal to operate and measure a third resistance value, and controlling a fourth driving module connected to the complementary data strobe terminal to operate and measure a fourth resistance value.

12. A computer device for testing a memory chip, the computer device comprising:
a memory storing processor-executable instructions; and
a processor configured to execute the processor-executable instructions to perform operations of:
in response to a read command for the memory chip, controlling a clock signal to be kept in a first state within a first preset time period and at the same time controlling a complementary clock signal to be kept in a second state within the first preset time period, the first state and the second state being opposite states;
in response to the clock signal kept in the first state and the complementary clock signal kept in the second state, keeping a data strobe signal in the first state within a second preset time period and at the same time keeping a complementary data strobe signal in the second state within the second preset time period, the data strobe signal being outputted by a data strobe terminal of the memory chip, the complementary data strobe signal being outputted by a complementary data strobe terminal of the memory chip; and
when the data strobe signal is kept in the first state and the complementary data strobe signal is kept in the second state, controlling a first driving module connected to the data strobe terminal to operate and measure a first resistance value and controlling a second driving module connected to the complementary data strobe terminal to operate and measure a second resistance value.

13. The computer device according to claim 12, wherein controlling the first driving module connected to the data strobe terminal to operate and measure the first resistance value comprises:
if the clock signal is kept in the first state, controlling the first driving module to act and provide a first test voltage to the data strobe terminal of the memory chip;
acquiring, by the data strobe terminal, a first test current when the memory chip is jointly driven by a power source voltage and the first test voltage; and
calculating the first resistance value according to the power source voltage, the first test voltage and the first test current.

14. The computer device according to claim 13, wherein acquiring, by the data strobe terminal, the first test current when the memory chip is jointly driven by the power source voltage and the first test voltage comprises:
acquiring, by the data strobe terminal, a first sampled test current when the memory chip is jointly driven by the power source voltage and the first test voltage;
acquiring an average of amplitudes of the first sampled test current within a first preset sampling time period, and determining whether the average is greater than or equal to a first preset current threshold;
if the average is greater than or equal to the first preset current threshold, outputting the average of the amplitudes of the first sampled test current; and
otherwise, reacquiring the first sampled test current.

15. The computer device according to claim 14, wherein calculating the first resistance value according to the power source voltage, the first test voltage and the first test current comprises:
calculating the first resistance value according to the power source voltage, the first test voltage and the average of the amplitudes of the first sampled test current.

16. The computer device according to claim 15, wherein calculating the first resistance value according to the power source voltage, the first test voltage and the average of the amplitudes of the first sampled test current comprises:
calculating the first resistance value $R_{pu}$ according to the following formula:

$$R_{pu} = \frac{V_{DDQ} - V_{Test1}}{I_{out1}},$$

where $V_{DDQ}$ is the power source voltage, $V_{Test1}$ is the first test voltage, and $I_{out1}$ is the average of the amplitudes of the first sampled test current.

17. The computer device according to claim 12, wherein controlling the second driving module connected to the complementary data strobe terminal to operate and measure the second resistance value comprises:
if the complementary clock signal is kept in the second state, controlling the second driving module to act and provide a second test voltage to the complementary data strobe terminal of the memory chip;
acquiring, by the complementary data strobe terminal, a second test current when the memory chip is driven by the second test voltage; and
calculating the second resistance value according to the second test voltage and the second test current.

18. The computer device according to claim 17, wherein the acquiring, by the complementary data strobe terminal, a second test current when the memory chip is driven by the second test voltage comprises:
acquiring, by the complementary data strobe terminal, a second sampled test current when the memory chip is driven by the second test voltage;
acquiring an average of amplitudes of the second sampled test current within a second preset sampling time period, and determining whether the average is greater than or equal to a second preset current threshold;
if the average is greater than or equal to the second preset current threshold, outputting the average of the amplitudes of the second sampled test current; and
otherwise, reacquiring the second sampled test current.

19. The computer device according to claim 18, wherein calculating the second resistance value according to the second test voltage and the second test current comprises:
calculating the second resistance value according to the second test voltage and the average of the amplitudes of the second sampled test current.

20. A non-transitory computer-readable storage medium having stored thereon computer-executable instructions that, when executed by a processor, cause the processor to perform a method for testing a memory chip, the method comprising:
in response to a read command for the memory chip, controlling a clock signal to be kept in a first state within a first preset time period and at the same time controlling a complementary clock signal to be kept in a second state within the first preset time period, the first state and the second state being opposite states;

in response to the clock signal kept in the first state and the complementary clock signal kept in the second state, keeping a data strobe signal in the first state within a second preset time period and at the same time keeping a complementary data strobe signal in the second state within the second preset time period, the data strobe signal being outputted by a data strobe terminal of the memory chip, the complementary data strobe signal being outputted by a complementary data strobe terminal of the memory chip; and when the data strobe signal is kept in the first state and the complementary data strobe signal is kept in the second state, controlling a first driving module connected to the data strobe terminal to operate and measure a first resistance value and controlling a second driving module connected to the complementary data strobe terminal to operate and measure a second resistance value.

\* \* \* \* \*